United States Patent [19]

Münz et al.

[11] Patent Number: 4,871,434

[45] Date of Patent: Oct. 3, 1989

[54] PROCESS FOR EQUIPMENT TO COAT TOOLS FOR MACHINING AND FORMING TECHNIQUES WITH MECHANICALLY RESISTANT LAYERS

[75] Inventors: Wolf-Dieter Münz, Freigericht; Bernd Hensel, Eschborn; Michael Scherer, Rodenbach; Otto Knotek, Aachen, all of Fed. Rep. of Germany

[73] Assignee: Leybold-Heraeus GmbH, Cologne, Fed. Rep. of Germany

[21] Appl. No.: 896,936

[22] Filed: Aug. 15, 1986

[30] Foreign Application Priority Data

Apr. 5, 1986 [DE] Fed. Rep. of Germany ....... 3611492

[51] Int. Cl.$^4$ .............................................. C23C 14/34
[52] U.S. Cl. ........................... 204/192.16; 204/192.15; 204/298
[58] Field of Search ....................... 204/192.15, 192.16, 204/298, 298 ME, 298 PM, 298 GF

[56] References Cited

U.S. PATENT DOCUMENTS 4,183,797  1/1980  Kennedy et al. .................. 204/298
4,544,468 10/1985  Münz et al. ......................... 204/298

FOREIGN PATENT DOCUMENTS 0142568  7/1980  Japan .................. 204/298
0197567 11/1984  Japan .................. 204/298
0046369  3/1985  Japan .................. 204/298

OTHER PUBLICATIONS

Waits, "Planar Magnetron Sputtering", from *Thin Film Processes*, (Vossen & Kern Eds., Academic Press, N.Y.), 1978, pp. 131-173.

*Primary Examiner*—Richard Boeker
*Attorney, Agent, or Firm*—Felfe & Lynch

[57] ABSTRACT

Process and apparatus for coating a tool with a layer of a compound which contains at least one of carbon and nitrogen and at least one of titanium, zirconium, chromium, tungsten, tantalum, vanadium, niobium, hafnium and molybdenum. The apparatus includes a vacuum chamber and a substrate holder for accommodating at least one tool with the substrate holder at a bias of between $-40$ and $-200$ V relative to ground. The apparatus includes at least two magnetron sputtering cathodes disposed in mirror symmetry to the substrate holder. The target contains at least one metal selected from the group consisting of T, Zr, Cr, W, Ta, V, Nb, Hf and Mo. The apparatus includes at least one gas source for supplying the vacuum chamber with a noble gas and a reaction gas. The reaction gas contains at least one of nitrogen and a gaseous carbon compound. The apparatus includes at least one anode in the edge region of each target so that the anodes are positioned in mirror symmetry with respect to the target holder. Each of the anodes is connected to a voltage means for applying a voltage of $+10$ to $+200$ V relative to ground.

7 Claims, 4 Drawing Sheets

PROCESS FOR EQUIPMENT TO COAT TOOLS FOR MACHINING AND FORMING TECHNIQUES WITH MECHANICALLY RESISTANT LAYERS

The invention relates to a process to coat tools for machining and forming engineering with mechanically resistant layers with at least one metal from the group comprising titanium, zirconium, chromium, tungsten, tantalum, vanadium, niobium, hafnium and molybdenum in their compounds with at least one element from the group comprising nitrogen and carbon, by cathode sputtering from at least two targets, disposed on either side of the tool, with at least one metal from the above group, especially with an addition of 5–60 atom percent of aluminum to the metal, in an atmosphere containing at least one gas from the group comprising nitrogen and a gaseous carbon compound, the tools being kept at a bias of −40 to −200 V relative to ground and being contacted by the plasma formed during the cathode sputtering and containing electrons and ions.

A process of the above kind is known from the German Offenlegungsschrift 3,107,914. By means of the bias applied at the substrate, not only is all around coating achieved with substrates, which are not rotating about their axis, but there is also an appreciable ion bombardment of the layer that is being built up. This ion bombardment leads to good adhesion to the substrate or tool and to a high density or hardness of the coating itself, so that the service life of the tools is increased markedly.

On the one hand, the ion bombardment of the substrate is desired for the aforementioned reasons. On the other, however, a correspondingly high bias of −250 V or higher must be selected. On the other, in tools with pronounced cutting edges, such a bias leads to a correspondingly high power, the so-called bias power, flowing over the substrate and, with that, to thermal damage to the substrate. Moreover, a high bias at the substrates, the so-called bias voltage, leads to high electrical field strengths at the edges and, with that, to an intensified ion bombardment in the region of these edges which, in turn, leads to wear of material at these sites. This accompanying phenomenon can lead not only to a decrease in the layer thickness of the applied material, but even to wear of substrate or base material, so that tips or edges are rounded off and lose their cutting ability. In other words, in the event of an unfavorable coincidence of process parameters and tool geometry, there may be damage to the substrate at the very places, which actually are to receive improved properties by means of the coating process.

From the preceding explanations, it follows that there are basically two diametrically opposed effects at work in the initially described process of coating tools. On the one hand, a high bias voltage brings about good adhesion to the base metal and a good layer structure, on the other, it causes a high bias power and, with that, damage to the substrate, which can lead to wear of layer material and of base metal.

It is therefore an object of the invention to retain the advantages of the known process without having to put up with its disadvantages, that is, the layer properties in the region of the cutting edges and tips of tools shall be improved for the known process.

This objective is accomplished inventively for the initially described process owing to the fact that the electrons, leaving the plasma, are accelerated once again by anodes, disposed in the edge region of each target and held at a voltage of +10 to +200 V relative to ground, in such a manner, that further ions are formed by the collision of these electrons with gas particles.

The following explanation is given to help in the understanding of this measure. For such coating processes, so-called magnetron cathodes are generally used as sputtering cathodes. These are cathode systems, in which there is a system of magnets behind the target. By means of this system of magnets, a closed tunnel, which is formed by lines of magnetic flux and which frequently is also referred to as a "magnetic trap" or a a "magnetic bottle", is formed on face of the target. Such a magnetic tunnel causes the plasma, which finally brings about the sputtering, to be concentrated in the vicinity of the target surface. Such magnetron cathodes, incidentally, are explained in greater detail in the German Offenlegungsschrift 3,107,914. In this publication, it is also stated how it can be brought about that, by carefully matching the geometric relationships of the equipment and of the process parameters as well as by appropriately choosing the magnetic field strength, the plasma reaches as far as the substrate that is to be coated or touches this.

Preferably, with such magnetron cathodes, there are in the vicinity of the target surface electrons, which move with elongation of their path of motion in a circular course about the lines of magnetic flux and moreover, if the initial pulse is appropriately aligned, along helical paths, so that the probability of colliding with particles of the gas atmosphere is increased appreciably. It is well known that the high sputtering rate of such magnetron cathodes can be attributed to this. However, as the number of collisions increases, the energy or velocity of the electrons gradually decreases, until they leave the magnetic tunnel and follow a path in the direction of the corresponding opposite potential, which usually is formed by metal parts of the equipment that are at ground potential, such as the vacuum chamber, substrate holders, cathode shieldings and gas distribution systems. It is also known, per se, to provide a special anode in the edge region of such cathodes, which are used only individually. This special anode "floats" together with the cathode, that is, it adjusts to a positive potential relative to mass as a result of the geometry of the system and the parameters of the process. In the known systems however, because of the high concentrating effect of the magnetic field on the plasma, there are no noticeable interactions between the (retarded) electrons and the gas atmosphere outside of this plasma.

In the inventive process on the other hand, in which the plasma has a significantly larger spatial extent, there is interaction between the electrons attracted by the anodes and the gas particles in the path of the electrons, so that additional ions are formed by this interaction. This effect already occurs at the relatively low anode voltages of +10 V. In this connection, it must be kept in mind that the greater portion of the cathode potential, which lies between about −300 V and −600 V, decays in the region of the so-called cathode fall of potential and that the potential approximately asymptotically approaches ground potential in the direction of the anode. Consequently, an anode voltage, which differs markedly from ground potential, already has a clear accelerating effect on the electrons.

By means of the inventive measure, it is possible to increase the flow of current over the substrate, since additional ions are produced by the anodes and their effect on the electrons. Due to the increase in the ion density in the plasma, the bias voltage can be reduced appreciably without a reduction in the bias current. By these means, a good adhesion and a good layer structure of the applied material is achieved, without causing damage to the substrate or, because of a high field effect, producing superproportional removal of the layer already applied or of the base metal. By these means, the machining output (in the case of machining tools), as well as the service life of coated tools are markedly increased.

For example, by means of an appropriate anode voltage, it has been possible to attain substrate currents, which are more than twice as high as those for a sputtering electrode without anodes, while at the same time the negative substrate bias is reduced significantly. With this, very dense layer structures with high adhesion strength could be produced on the base material.

The invention also relates to equipment for carrying out the process described above. This equipment, in a conventional manner, has a vacuum chamber with a substrate holder for accommodating at least one tool, a voltage source for supplying the substrate holder with a bias of between −40 and −200 V relative to ground, at least two sputtering cathodes disposed mirror symmetrically to this substrate holder, each cathode with a target and a magnet arrangement for enclosing the plasma between the respective target and the workpiece, the target having at least one metal from the group comprising Ti, Zr, Cr, W, Ta, V, Nb, Hf and Mo and preferably a proportion of 5–60 atom percent of Al, as well as at least one gas source for supplying the vacuum chamber with a noble gas and at least one reaction gas from the group comprising nitrogen and a gaseous carbon compound for producing a reactive sputtering atmosphere in the region of the sputtering electrode.

Such equipment for accomplishing the same objective is characterized by the fact that, in the edge region of each target, at least one anode is disposed in a known manner in such a way that there is at least one anode on either side of the substrate holder in mirror symmetrical arrangement to the substrate holder, and at least one voltage source by means of which a voltage +10 to +200 V relative to ground can be applied to the anodes is assigned to the anodes.

The addition (known per se) of aluminum to the target material accomplishes that the layer material, formed by the reactive sputtering process, has the composition $(MeAl)N_x$ or $(MeAl)C_x$, Me being one of the above metals. Such a surface layer already leads to a marked increase in service life of tools coated with it. The proportion of aluminum in the target alloy may lie between 5 and 60 atom percent, but preferably is selected to be between 40 and 50%. It will yet be shown that, due to the use of the inventive measure in conjunction with such a target alloy, exceptionally long service lives are achieved for tools coated with the reaction product.

Tools for machining techniques are drills, screw taps, milling cutters, knife heads, throwaway carbide indexable inserts and reamers. Tools for forming techniques are press tools, coining dies, die plates and drawing dies. Such tools frequently also have sharp edges, which should not wear out prematurely.

According to the further invention, a particularly advantageous refinement of the object of the invention is characterized by the fact that the voltage source(s) for the anodes is connected with its negative pole to the associated sputtering cathode(s) and that the positive pole, which is connected to the anode, is furthermore connected over an additional voltage source to ground in such a manner, that the potential of the anode(s) can be raised to a value in the range of +40 to +200 V.

Due to the additional voltage source, the free "floating" is replaced by a defined positive potential, as a result of which the coating process can be stabilized further. Depending on the geometric relationships of the equipment and the process parameters, free "floating" anode potentials can reach values of almost +40 V; on the other hand, the potentials can be specified also in the given range by means of the additional voltage source. There is little point to exceeding the upper limit of the range of +200 V, because completely satisfactory results are already obtained within the given range.

The object of the invention is suitable for batch operations as well as for continuous operation in installations which can be operated continuously or quasi-continuously. Usually, the substrates or tools are fastened to or in a substrate holder, which transports the substrates into and out of the space between the targets. This transporting may be continuous or stepwise. In a stepwise motion, the substrate holder is held for the duration of the coating process in such a manner, that the substrates are in the space between the targets. It is then possible to keep a majority of substrate holders in readiness in the path of motion of the substrate and to introduce them, one after the other, in the space between the targets. It is sufficient if the mirror symmetry of substrates and targets is essentially maintained during the coating process, that is, a deviation in the substrate position due to the curvature of the transporting path is not critical.

For such continuous or quasi-continuous processes, preferably rectangular sputtering cathodes with a long and a short target side are used, the transporting direction running perpendicularly to the long target side. With such a sputtering cathode, it is particularly advantageous to equip the substrate holder with at least one individual holding device and preferably with several individual holding devices, each for placing a tool, having a longitudinal axis, into such a spatial position, that this longitudinal axis is parallel to the target surfaces, but runs at an angle of 30° to 80° to the long target sides.

In this connection, it is particularly advantageous if several individual holding devices of the substrate holder are aligned with respect to two opposite targets in such a manner, that the longitudinal axes of the tools are aligned in herringbone fashion.

By means of the angular position of the tool axes, given above, the following is achieved. As more of the effective target area is "seen" by the respective area element of the tool under consideration, the coating in the circumferential direction of the tools becomes thicker and more uniform. The relationships, especially for such surface elements, which run essentially perpendicularly to the surfaces of the targets, are critical. If the tool axes (for example, in the case of drills) would run perpendicularly to the transporting direction or parallel to the long target sides, then the maximum "viewing angle" would correspond to the target width, that is, to the short target side. Particularly disadvantageous are the relationships in the magnetron cathodes, in which the effective target area corresponds to a linear erosion trough. In other words, the effective target area of a rectangular target in the transporting direction is very much smaller than the target width. However, due to the inventive inclination of the tool axes, said "viewing angle" of the area element is enlarged and corresponds in the limiting case, for example, to the length of the target diagonals or to the long target side. This results not only in a more uniform coating in the circumferential direction (about the axis of the tool), but also in better adhesion to the substrate and in a better layer structure, because the proportion of material particles, which strike tangentially or in glancing fashion, decreases and moreover in favor of material particles, which strike the tool surface at a substantially more favorable solid angle. Optimum relationships would exist, if the material particles were to strike each area element perpendicularly. With stationary substrates, this condition is, however, attained only approximately for the critical regions named above; these relationships are, however, improved distinctly by placing the axes of the tools in the given, inclined position.

Particularly good coating results with an average prolongation of service life by a factor of about 2 relative to the state of the art are attained by placing the axes of the tools in the inclined position described above in combination with using a layer system having the composition (TiAl) $N_2$, a target alloy containing 50 atom percent of Ti and 50 atom percent of Al being the starting material.

Provided that the distance between opposite surfaces of the targets is sufficiently large and constant, the object of the invention is not particular critical with respect to the tool diameter, it being assumed that the tool axis is passed through the space between the targets in the plane of symmetry between the targets. In this connection, it is even possible to load one and the same substrate holder with parts having very different diameters, which may range from 1 to 25 mm without causing problems.

Examples of the operation of the object of the invention are described below by means of FIG. 1-4.

Figure 1:
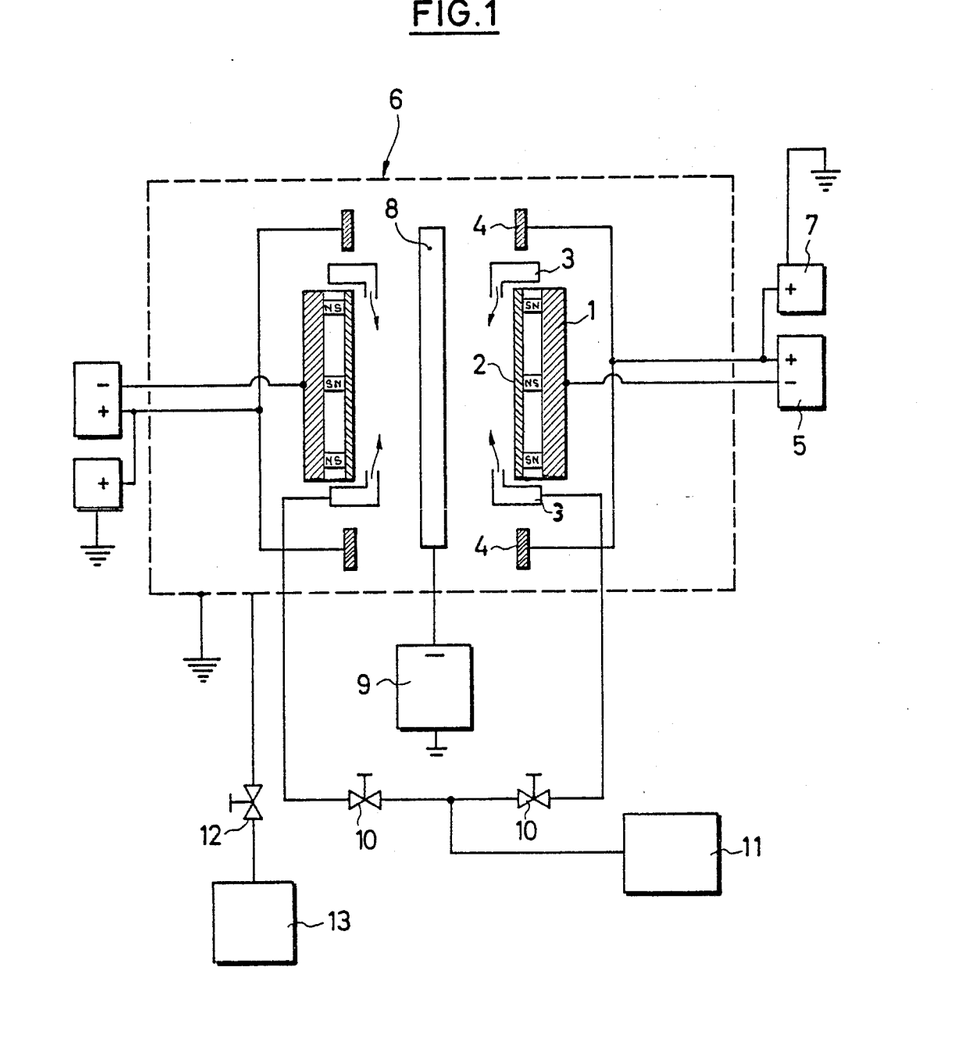
FIG. 1 shows a diagrammatic representation of equipment for carrying out the inventive process.

In FIG. 1, a basic cathode body 1 is shown, which consists in a known manner of a hollow (copper) object, in which a magnet system is accommodated and which is connected to a circulating coolant that s not shown. This basic cathode body is equipped with a target 2, the two being joined by connection, which conducts heat well. The target consists of one of the materials given above. On at least two sides of the rectangular target 2 (in the case of circular targets, preferably along the whole of the circumference), a gas distributor 3 is disposed, through which the reaction gas, required to form the mechanically resistant material, is supplied to the target. Additionally, one of the conventional sputtering gases (noble gas, preferably argon) can also be supplied through this gas distributor. It is, however, also possible to introduce this sputtering gas at a different place in the system.

Along its two long sides, the rectangular target 2 is surrounded by anodes 4, the potential of which may be in the range of +10 V to +200 V. This value is to be seen in relation to a voltage of −300 V to −600 V at the basic cathode body. A voltage source 5, which is not connected directly to ground, supplies the basic cathode body 1 and the anodes 4. By these means, the basic cathode body 1 and the anodes could adjust to a free potential relative to the vacuum chamber 6, which is at ground potential. However, between the positive pole of the voltage source 5, which is connected to the anodes 4, and the ground potential, there is yet an additional voltage source 7, by means of which the potential of the anodes 4 can be raised, for example, in the range from +40 to +200 V.

In front of the free surface of the target 2, a (movable) substrate holder 8 is disposed, the main plane of which, running perpendicularly to the plane of the drawing, is aligned plane-parallel to the target 2. Relative to ground, this substrate holder is connected through a voltage source 9 to a negative potential relative to ground, that is between −40 V and −200 V.

On the opposite side of substrate holder 8, an identical system is disposed in mirror symmetrical fashion, said system consisting of a basic cathode body, a target, a gas distributor, anodes and the associated voltage sources, which are, however, not individually labelled.

Figure 2:
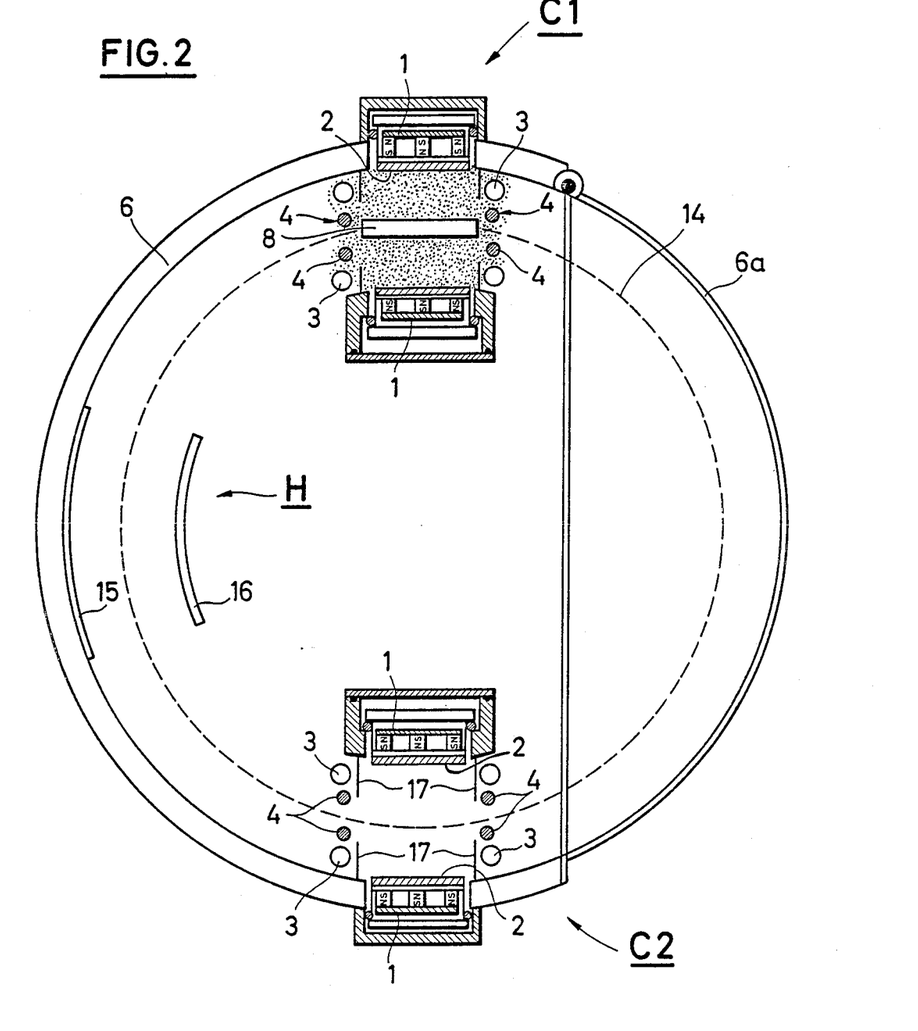
FIG. 2 shows a horizontal section through batch-operated equipment with a circular path of motion for the substrate.

The whole arrangement is surrounded by the vacuum chamber 6, in which an operating vacuum, necessary for cathode sputtering, is maintained by means of vacuum pumps, which are not shown. The effect, given in the detailed description, is achieved by means of the arrangement shown in conjunction with the given potential differences. The gas distributors 3 are connected over control valves 10 with a gas source 11 for the reaction gas (nitrogen and/or a gaseous carbon compound). The vacuum chamber 6 is connected over a further control valve 12 with a further gas source 13 with one of the conventional sputtering gases (argon). In FIG. 2 the installation of two cathode systems C 1 and C 2 in the cylindrical vacuum chamber 6 is shown and, moreover, the basic cathode body 1, lying radially on the outside, is incorporated in the wall of the vacuum chamber 6. The substrate holder 8, drawn in simplified fashion, rotates continuously or stepwise on a circular path of motion 14, which also passes through a heating station H, comprising two heating elements 15 and 16, by means of which the substrates can be preheated to a temperature advantageous for the coating process.

The basic cathode body 1, lying on the outside, is inserted in the (cylindrical) wall of the vacuum chamber 6, while the basic cathode body, lying on the inside, is attached to a holding device, which lies in the vacuum chamber and is not shown. The vacuum chamber 6 also has a segmented door 6a for charging the equipment.

It can furthermore be inferred from FIG. 2 that the reaction spaces lying between the targets 2, are partially bounded by shields 17 which, however, permit the reaction gas to be introduced from the gas distributors 3. The anodes 4 are also so disposed, that the electrons, leaving the plasma, are accelerated in the direction of the anodes 4. In any case, the gas emerges from the gas distributors 3 in the direction of the openings between the shields 7.

Figure 3:
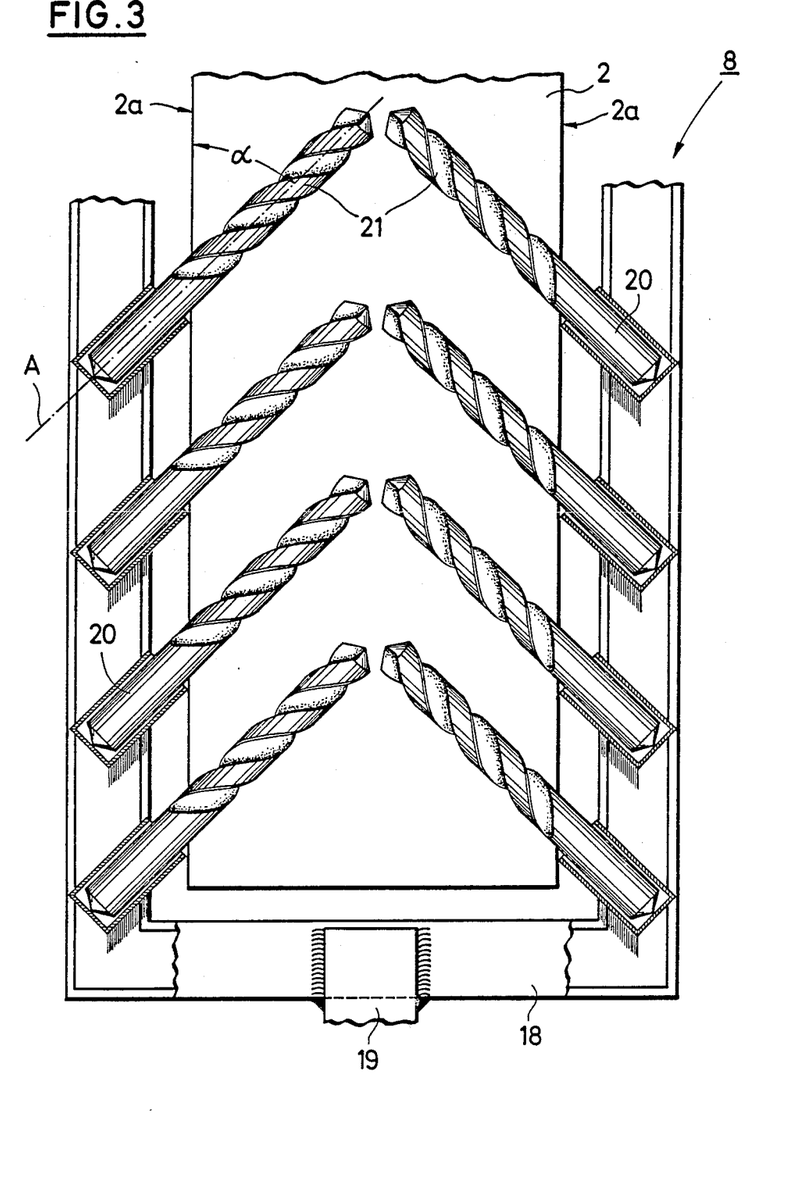
FIG. 3 shows a side view of a substrate holder with several tools (drills) held in herringbone fashion, as well a plan view of the target lying in the rear.

FIG. 3 shows a substrate holder 8 in the form of rectangular frame 18, which is supported over a bracket 19 on a transporting mechanism, which is not shown and which guides the substrate holder 8 on the path of motion 14 shown in FIG. 2. The frame 18 comprises a hollow profile, open towards the inside, to which a large number of individual holding devices 20 are attached, which comprise sleeves that are closed off on one side. In each case one tool 21 is inserted in these individual holding devices. In the present case, the tool is formed by a drill, the longitudinal axis A of which forms an angle "α" with the long sides 2a of the target. In the example of the operation of FIG. 3, this angle is 45°. The longitudinal axes of the tools 21 are thus aligned in herringbone fashion.

EXAMPLE

In equipment, the details of which are shown in FIGS. 2 and 3 (drills, with a diameter of 6 mm, inclined at an angle of 45°), targets of Ti/Al, with 50 atom percent portions of each, were atomized. The targets were prepared from powders of the two components by a powder metallurgical pressing process. The tools 21 consisted of drills of high-speed steel with a diameter of 6 mm and previously been cleaned appropriately. After a pressure of less than $10^{-4}$ mbar was reached, the tools 21 were heated in the heating device H by means of radiant heat to a temperature of about 400° C. Immediately upon reaching this temperature, the tools were moved into the cathode system C 2 (the cathode system C1 was not required in this experiment), and argon was admitted over the gas distributors 3, until a pressure of $1.5 \times 10^{-2}$ mbar was reached. At this pressure, a low-power plasma was energized in the C 2 cathode system. The cathode system was operated in this case without the voltage source 7, so that the anode voltage adjusted to a value of +28 V. By applying a negative potential over appropriate sliding contacts to the substrate holder 8, which was insulated from the vacuum chamber), an ion etching process was first of all carried out, by means of which the surfaces of the tools 21 were cleaned physically without a decrease in the substrate temperature.

After an etching time of 10 minutes, the flow of argon in the gas distributor 3 was reduced, until a pressure of $10^{-2}$ mbar was reached. Hereupon, the reaction gas (nitrogen) was mixed in with the argon. With a power density of 7 W/cm$^2$ relative to the target surface and a nitrogen partial pressure of $6 \times 10^{-4}$ mbar, an average atomization rate of 3.0 nm/sec was achieved. The coating process was continued, until a (Ti, Al) N layer, 4 μm thick, had been deposited. Investigations of the hardness revealed values of H $V_{0.01} = 2,300$. The service life behavior of drills, so coated, was determined as follows by means of drilling experiments.

Drilled holes, 15 mm deep, were produced with the 6 mm drills in panels of the X210CrW12 material. The cutting speed was 20 m/minute at a advance rate of 0.2 mm per revolution. The above alloy was deliberately selected as the material to be drilled because it contains carbide particles, which result in particularly high abrasive wear. By these means, it is entirely possible to carry out comparison experiments with other surface coatings or coating processes in a relatively short experimental time.

Figure 4:
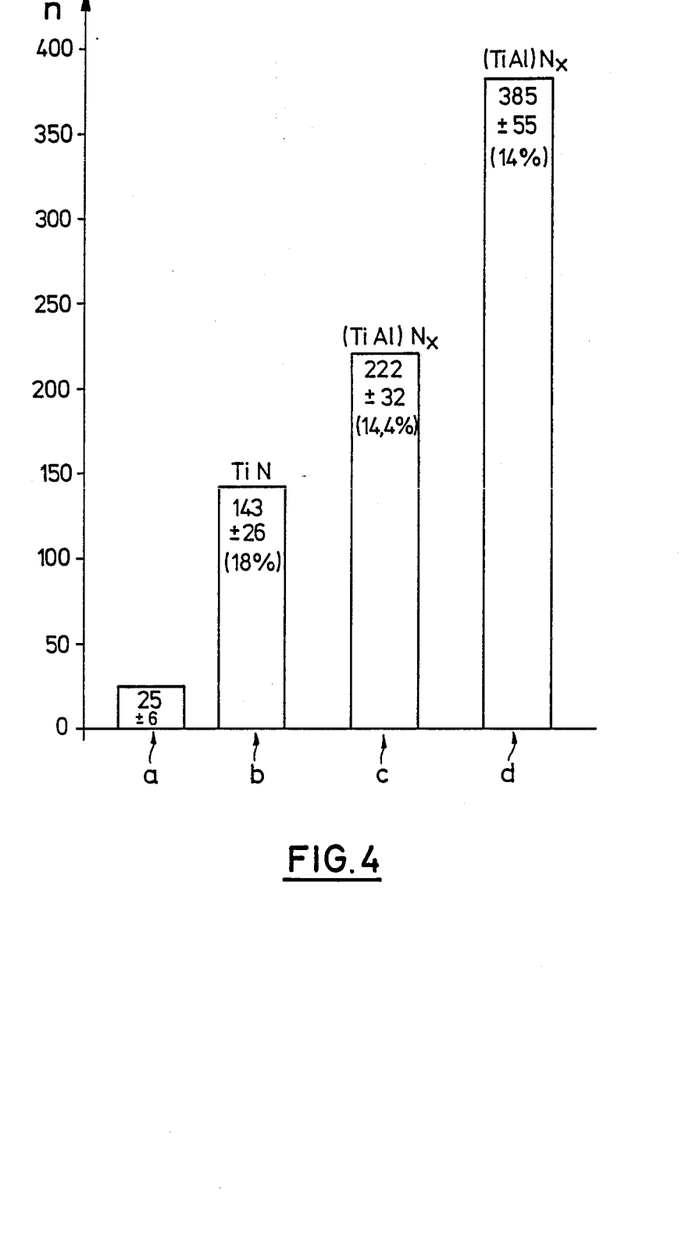
FIG. 4 shows a bar diagram of the service lives, achievable with the different coating processes, using drills as an example.

In FIG. 4, the number of drilling processes, carried out until the layer has worn away (ordinate values), are compared. Bar "a" shows that an average of only 25 drillings could be carried out with uncoated drills, before the drills failed because of the wear of their cutting edges. Bar "b" shows that, with a conventional mechanically resistant coating of TiN, only 143 drillings could be carried out on the average before the drills succumbed to wear. Bar "c" shows that, with (TiAl) N$_x$ coatings, which are also conventional, admittedly an average of 222 drillings could be carried out before the drills wore out because the layer had worn away. Bar "d" shows the results when the inventive process and equipment was used. In this case, an average of 385 drillings could be carried out before the drills failed due to wear.

In comparison to the state of the art, such a behavior can be described as outstanding.

COMPARISON EXPERIMENT

After the anodes 4 were dismantled, the bias current, flowing over the substrate, dropped to less than half. The drills, produced therewith, exhibited a behavior that, with respect to the service life, corresponded to bar "c".

We claim:

1. Process for coating a tool having a cutting edge with a layer of a compound which contains at least one of carbon and nitrogen and at least one of titanium, zirconium, chromium, tungsten, tantalum, vanadium, niobium, hafnium, and molybdenum, the process preventing thermal damage and wear of edge material of the tool, comprising magnetron-cathode sputtering said tool with said compound, wherein said compound is cathodically sputtered from at least two targets in a sputtering apparatus, said targets positioned on either side of said tool, said sputtering taking place in an atmosphere containing at least one nitrogen or carbon containing reactive gas, which is supplied to said targets by gas distributors disposed along at least two long sides of the said two targets, said tool being kept at a bias of $-40$ to $-200$ V relative to ground, wherein contact of said tool with electrons and ions produced by cathode sputtering is achieved by anode means disposed at edge regions and along at least two long sides of said targets, which anode means are positioned beyond said gas distributors and at a voltage of $+10$ to $+200$ V relative to ground, wherein electrons leaving plasma in said cathode sputtering are accelerated through the gas towards said anode means so as to cause formation of further ions by collision of said electrons with particles of said reactive gas.

2. Process of claim 1, wherein said target contains form 5 to 60 atom percent of aluminum.

3. Apparatus for cathode sputtering a tool having a cutting edge with a layer of a compound which contains at least one of carbon and nitrogen and at least one of titanium, zirconium, chromium, tungsten, tantalum, vanadium, niobium, hafnium and molybdenum, while preventing thermal damage and wear of edge material of the tool, comprising a vacuum chamber, substrate holder means for accommodating at least one tool which is equipped with voltage means for supplying said holder means with a bias of between $-40$ and $-200$ V relative to ground, at least two magnetron sputtering cathodes disposed in mirror symmetry to said substrate holder for contacting said tool with electrons and ions, wherein each cathode has a target having a long side and magnet means for enclosing plasma between said target and said holder, wherein said target contains at least one metal selected from the group consisting of Ti, Zr, Cr, W, Ta, V, Nb, Hf and Mo, at least two gas distributors disposed along at least said two long sides of said two targets for supplying said vacuum chamber with noble gas and a reaction gas, said reaction gas containing at least one of nitrogen and a gaseous carbon compound, and at least one anode in the edge region of each target and along at least the said two long sides of said targets so that said anodes are positioned in mirror symmetry with respect to said substrate holder means, and said anodes being positioned beyond said gas distributors, each of said anodes having connected thereto a voltage means for applying a voltage of +10 to +200 V relative to ground, wherein electrons leaving plasma in said cathode sputtering are accelerated through the gas towards said anodes so as to cause formation of further ions by collision of said electrons with particles of said reactive gas.

4. Apparatus of claim 3, wherein the voltage source for the anodes is joined with its negative pole to the corresponding sputtering cathodes and the positive pole connected with the anodes is joined over a further voltage source to ground in such a manner that the potential of the anodes can be raised in the range of +40 to +200 V.

5. Apparatus of claim 3, wherein said targets are rectangular, and said substrate holder is positioned so that its longitudinal axis is parallel to the target surface but at an angle of from 30° C. to 80° C. with respect to the longer sides of said rectangular target.

6. Apparatus of claim 3, wherein said target contains from 5 to 60 atom percent of aluminum.

7. Apparatus for cathode sputtering a tool with a compound comprising a vacuum chamber, a substrate holder for accommodating at least one tool which is equipped with a voltage source to supply said holder with a bias of between −40 and −200 V relative to ground, at least two magnetron sputtering cathodes disposed in mirror symmetry to said substrate holder, wherein each cathode has a target and magnet arrangement for enclosing plasma between said target and said holder, wherein said target contains at least one metal selected from the group consisting of Ti, Zr, Cr, W, Ta, V, Nb, Hf, Mo, at least one gas source for supplying said vacuum chamber with noble gas and a reaction gas, said reaction gas containing at least one of nitrogen and a gaseous carbon compound, and at least one anode in the edge region of each target so that said anodes are positioned in mirror symmetry with respect to said substrate holder, each of said anodes having connected thereto a voltage means for applying a voltage of +10 to +200 V relative to ground, wherein said targets are rectangular, and said substrate holder is positioned so that its longitudinal axis is parallel to the target surface but at an angle from 30° C. to 80° C. with respect to the longer sides of the rectangular target, said apparatus further comprising a plurality of individual holding devices of said substrate holder, said devices being aligned so that tools held thereby align in herringbone fashion.

* * * * *

UNITED STATES PATENT AND TRADEMARK OFFICE
CERTIFICATE OF CORRECTION

PATENT NO. : 4,871,434

DATED : October 3, 1989

INVENTOR(S) : Wolf-Dieter Münz, et al.

It is certified that error appears in the above-identified patent and that said Letters Patent is hereby corrected as shown below:

On the title page:
Abstract, line 12 for "T, Zr" read

-- Ti, Zr --.

Signed and Sealed this

Fourteenth Day of July, 1992

Attest:

DOUGLAS B. COMER

*Attesting Officer*        *Acting Commissioner of Patents and Trademarks*